United States Patent
Zakel et al.

(10) Patent No.: US 6,915,940 B2
(45) Date of Patent: Jul. 12, 2005

(54) DEVICE FOR APPLYING SOLDER GLOBULES

(75) Inventors: Elke Zakel, Falkensee (DE); Ghassem Azdasht, Berlin (DE)

(73) Assignee: Pac Tech-Packaging Technologies GmbH, Nauen (DE)

( * ) Notice: Subject to any disclaimer, the term of this patent is extended or adjusted under 35 U.S.C. 154(b) by 36 days.

(21) Appl. No.: 10/474,450

(22) PCT Filed: Apr. 12, 2002

(86) PCT No.: PCT/EP02/04121

§ 371 (c)(1),
(2), (4) Date: Dec. 3, 2003

(87) PCT Pub. No.: WO02/083350

PCT Pub. Date: Oct. 24, 2002

(65) Prior Publication Data

US 2004/0094600 A1 May 20, 2004

(30) Foreign Application Priority Data

Apr. 12, 2001 (DE) ................................ 201 06 464 U

(51) Int. Cl.⁷ ............................ B23K 1/00; B23K 5/00; B23K 20/14; B23K 37/00
(52) U.S. Cl. ......................... 228/41; 228/5.5; 228/49.5
(58) Field of Search ..................... 228/106, 179.1, 228/180.22, 245, 246, 248.1, 5.5, 33, 41, 49.5

(56) References Cited

U.S. PATENT DOCUMENTS

| | | | | |
|---|---|---|---|---|
| 5,284,287 A | * | 2/1994 | Wilson et al. | 228/180.22 |
| 5,467,913 A | * | 11/1995 | Namekawa et al. | 228/41 |
| 5,653,381 A | * | 8/1997 | Azdasht | 228/254 |
| 5,656,339 A | | 8/1997 | Wesseling et al. | |
| 5,938,951 A | * | 8/1999 | Azdasht | 219/121.64 |
| 5,977,512 A | | 11/1999 | Azdasht et al. | |
| 6,227,437 B1 | * | 5/2001 | Razon et al. | 228/254 |
| 6,386,433 B1 | * | 5/2002 | Razon et al. | 228/246 |
| 6,634,545 B2 | * | 10/2003 | Razon et al. | 228/246 |
| 6,680,213 B2 | * | 1/2004 | Farnworth et al. | 438/15 |

FOREIGN PATENT DOCUMENTS

| | | |
|---|---|---|
| DE | 201 06 464 U1 | 9/2001 |
| EP | 1 029 626 A2 | 8/2000 |
| WO | WO 95/00279 | 1/1995 |

* cited by examiner

Primary Examiner—Colleen P. Cooke
(74) Attorney, Agent, or Firm—Dougherty, Clements, Hofer & Bernard

(57) ABSTRACT

An apparatus for applying solder balls to a substrate and for remelting the solder balls on soldering points of the substrate has a capillary for supplying a solder ball to the soldering points and for placing the solder ball at the free end of the capillary opposite the soldering point, a means for supplying heat to the solder ball to remelt it, and a pressing apparatus for holding down the substrate to prevent the substrate from being resilient when placing and remelting the solder ball.

5 Claims, 1 Drawing Sheet

US 6,915,940 B2

DEVICE FOR APPLYING SOLDER GLOBULES

BACKGROUND OF THE INVENTION

1. Field of the Invention

The present invention relates to an apparatus for applying solder balls.

2. Description of the Related Art

In particular, the present invention deals with an apparatus for applying solder balls to a substrate for remelting the solder balls on soldering points of the substrate.

Such apparatuses serve for the production of contact metalizations, and typically include a laser light source for emitting a laser beam, a reservoir with a supply of solid-state solder, which is subsequently simply denoted as solder balls, a protective gas source, a capillary, with which the solder balls are supplied from the reservoir to a free end of the capillary, typically with assistance of the protective gas carried under pressure, and a controller with which the apparatus for applying solder balls is positioned opposite the substrate or substrate support, or a chip with overlaying substrate support, whereupon a solder ball is supplied to the free end of the capillary, a controller then making the laser light source heat and remelt the positioned solder ball with a laser beam.

Such systems are exemplarily known from U.S. Pat. No. 5,977,512 and from WO 95/00279.

Such apparatuses for applying and remelting solder balls are frequently used in the production of contact metalizations on flexible substrate materials or in the production of solder bumps on soldering points of a flexible substrate support. Here, it may come to misplacements of the solder ball opposite the desired soldering point.

It is the object of the present invention is to further develop an apparatus for applying solder balls of the kind mentioned above, such that the reliability in the production of solder joints is further increased.

SUMMARY OF THE INVENTION

In accordance with a first aspect of the invention, this object is achieved by an apparatus for applying solder balls to a substrate, and for remelting the solder balls on soldering points of the substrate; with

- a capillary for supplying a solder ball to the soldering point and for placing the solder ball at the free end of a capillary opposite the soldering point;
- a means for supplying heat to the solder ball for remelting the same; and
- a pressing apparatus for holding down the substrate to prevent the substrate from being resilient when placing and remelting the solder ball.

According to the invention, with an apparatus of the kind mentioned above, another apparatus is disposed at the free end of the capillary, which serves to hold down the substrate or substrate support, and which prevents the substrate or substrate support from being resilient when placing the solder ball.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 1:
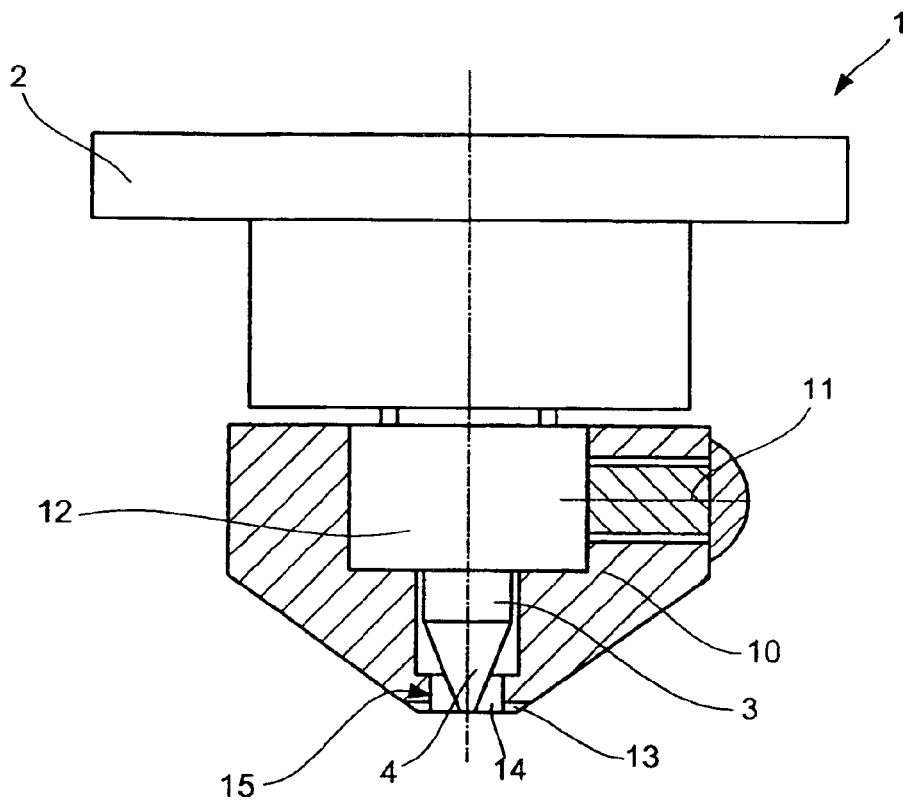
FIG. 1 is a schematic side view, partly as sectional illustration, of an embodiment of the apparatus for applying solder balls.
Figure 2:
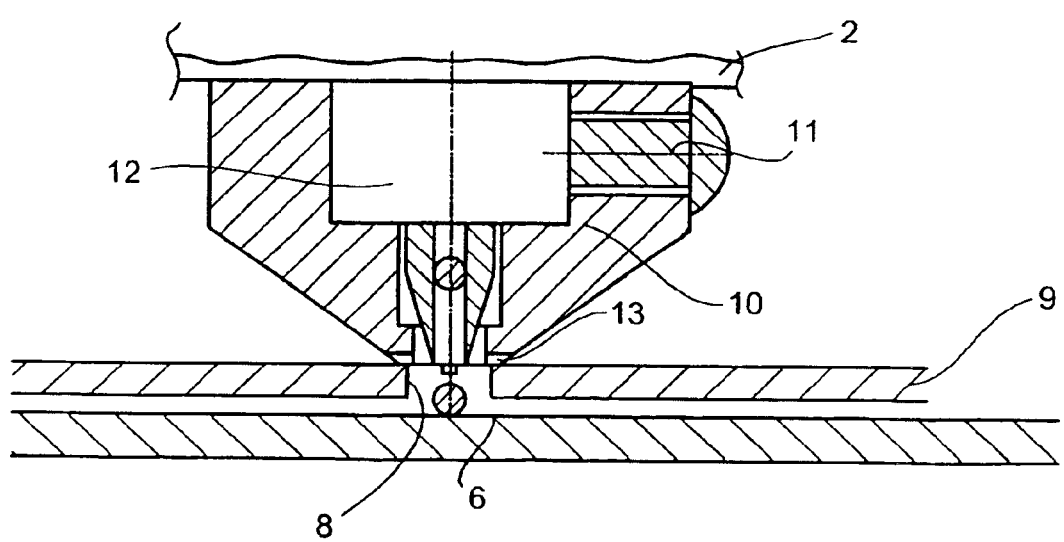
FIG. 2 is a schematic fragmented view of the embodiment shown in FIG. 1, to illustrate the pressing of the substrate support by the pressing apparatus during placing the solder ball.

As shown in FIG. 1, the apparatus for applying solder balls to a substrate and for remelting the solder balls on soldering points of the substrate, which is denoted in its entirety by reference numeral 1, includes a capillary holder 2, which serves to hold a capillary 3, which has a free capillary end 4. As can be seen in FIG. 2, solder balls 5 may be supplied through these capillaries to soldering points 6 on a substrate base 7, which is in the area of an opening 8 of a flexible substrate 9. In the embodiment shown herein, the apparatus 1 is provided with a truncated-cone-shaped hold-down device which is mounted or fixed to a head part 12 of the capillary holder 2 via a clamping screw 11, wherein this head part may be designed as a nut or thread connection for mounting of the hold-down device 10 opposite the capillary holder 2.

The truncated-cone-shaped hold-down device 10 functions as a pressing apparatus for the flexible substrate 9 opposite the substrate base 7 in the area of its fitting surface 13.

The relative location of the fitting surface 13 opposite the free end 4 of the capillary 3 in an axial direction of the capillary may be adjusted when the clamping screw 11 is disengaged, and then be fixed by fastening the clamping screw 11. The fitting surface comprises a recess 14, which is embodied in the preferred embodiment as a cross-sectionally circular bore whose diameter is sized such that the inside edge 15 of the fitting surface 13, which is determined by the recess 14, is radially spaced from the outside wall of the tapering tip of the free end 4 of the capillary 3.

Regarding the construction, which otherwise corresponds to the prior art, of the rest of the structure of the apparatus for applying solder balls, in particular with respect to the laser light source, the reservoir for the solid solder in the shape of solder balls, regarding the protective gas source and the control, reference may exemplarily be made to U.S. Pat. No. 5,977,512, so that a renewed description of these components and their mode of operation may be omitted.

Regarding the functionality of present invention, it is obvious to a skilled person that instead of the laser light source mentioned other energy sources for supplying heat to the solder balls may as well be used for the purpose of remelting the solder balls. Likewise, it is irrelevant whether the heat transfer to the solder balls takes place in a contact-free manner or a movable energy transfer means is put on the solder balls, as it is described in WO 95/00279.

The inventive structure of the apparatus for applying solder balls with the pressing apparatus disposed at the free end of the capillary for holding down the substrate is particularly suitable in such apparatuses in which the solder balls are fired to the soldering point 6 from the solder ball dicing unit through the capillary 3 under the effect of the pressure of a protective gas source, such as a nitrogen source, to be then remelted by means of the laser beam. By the mechanical fixing of the substrate, which is achieved by holding down the substrate by means of the pressing apparatus 10, a defined fixing of the solder ball opposite the soldering point 6 takes place during the remelting process, whereby a reliable remelting of the solder ball in a defined location opposite the soldering point is achieved.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An apparatus for applying solder balls to a substrate (7, 9), and for remelting the solder balls on soldering points (6) of the substrate (7, 9); with
    a capillary (3) for supplying a solder ball (5) to the soldering point (6) and for placing the solder ball (5) at the free end (4) of a capillary (3) opposite the soldering point;
    a means for supplying heat to the solder ball (5) for remelting the same; and
    a pressing apparatus (10) for holding down the substrate (7, 9) to prevent the substrate (7, 9) from being resilient when placing and remelting the solder ball (5).

2. The apparatus of claim 1, wherein the pressing apparatus (10) has a fitting surface (13), which has a recess (14) through which the free end (4) of the capillary (3) extends.

3. The apparatus of claim 2, wherein the recess (14) is substantially circular and sized such that an inside edge (15) of the fitting surface (13), which is determined thereby, is radially spaced apart from an outside wall of the capillary (3) in the area of its free end (4).

4. The apparatus of one of claims 1 to 3, wherein the pressing apparatus (10) is designed in a truncated-cone-shaped manner.

5. The apparatus of one of claims 1 to 4, wherein the pressing apparatus (10) is fixable in a predeterminable location in the axial direction of the capillary (3) relative to the capillary (3).

* * * * *